(12) United States Patent
Gill et al.

(10) Patent No.: US 9,892,899 B2
(45) Date of Patent: Feb. 13, 2018

(54) ION MANIPULATION DEVICE FOR GUIDING OR CONFINING IONS IN AN ION PROCESSING APPARATUS

(71) Applicant: SHIMADZU CORPORATION, Kyoto (JP)

(72) Inventors: Matthew Clive Gill, Manchester (GB); Roger Giles, Manchester (GB)

(73) Assignee: SHIMADZU CORPORATION, Kyoto-shi, Kyoto (JP)

( * ) Notice: Subject to any disclaimer, the term of this patent is extended or adjusted under 35 U.S.C. 154(b) by 0 days.

(21) Appl. No.: 15/430,878

(22) Filed: Feb. 13, 2017

(65) Prior Publication Data

US 2017/0287689 A1   Oct. 5, 2017

(30) Foreign Application Priority Data

Mar. 29, 2016   (GB) .................................. 1605180.7

(51) Int. Cl.
H01J 49/00   (2006.01)
H01J 49/06   (2006.01)

(52) U.S. Cl.
CPC .................................. H01J 49/063 (2013.01)

(58) Field of Classification Search
CPC .............................. H01J 49/063; H01J 49/065
USPC ................ 250/281, 282, 283, 288, 290, 294
See application file for complete search history.

(56) References Cited

U.S. PATENT DOCUMENTS 8,835,839 B1   9/2014   Anderson et al.
2014/0291506 A1*  10/2014   Tikhonski ............ H05H 1/2406
                                                          250/282

FOREIGN PATENT DOCUMENTS

GB   2 422 051 A       7/2006
GB   2495173 A         4/2013
WO   2012/150351 A1   11/2012

OTHER PUBLICATIONS

J.F. O'Hanlon, et al., A User's Guide to Vacuum Technology, Third Edition, pp. 32-34.

* cited by examiner

*Primary Examiner* — Nicole Ippolito
*Assistant Examiner* — Hanway Chang
(74) *Attorney, Agent, or Firm* — Sughrue Mion, PLLC

(57) ABSTRACT

An ion manipulation device for guiding or confining ions in an ion processing apparatus. The device has a first circuit board, wherein at least one first electrode for manipulating the path of ions is mounted on a mounting surface of the first circuit board; a second circuit board, wherein at least one second electrode for manipulating the path of ions is mounted on a mounting surface of the second circuit board; at least one bridging electrode for manipulating the path of ions, wherein the at least one bridging electrode is mounted to both the mounting surface of the first circuit board and the mounting surface of the second circuit board, wherein the bridging electrode is configured to hold the first circuit board and the second circuit board apart from each other in a fixed spatial relationship in which the mounting surface of the second circuit board faces towards the mounting surface of the first circuit board.

15 Claims, 8 Drawing Sheets

Section A-A

Section B-B

US 9,892,899 B2

ION MANIPULATION DEVICE FOR GUIDING OR CONFINING IONS IN AN ION PROCESSING APPARATUS

FIELD OF THE INVENTION

This invention relates to an ion manipulation device for guiding or confining ions in an ion processing apparatus.

BACKGROUND

Ion guides, ion traps, ion stores and fragmentation devices are frequently used in mass spectrometers. These structures are used, for example, to transport ions between structures in the mass spectrometer, such as between a mass selection region and a time-of-flight region, or to temporarily store and/or fragment ions. This is generally achieved by use of a multipole device such as a quadrupole device (other multipole devices are possible, e.g. a hexapole device or an octapole device). As there is typically no analytical capability required of multipole devices, they are generally manufactured to looser tolerance requirements (i.e. lower accuracy) than devices used for mass analysis. Consequently, the manufacturing/assembly method used to form a multipole device should be chosen appropriately. For example, the use of high accuracy ceramics and ground electrodes would normally be considered inappropriate for manufacturing multipole devices, as these methods are more expensive and therefore normally reserved for components requiring high accuracy.

The present invention was devised by inventors searching for a simple method to manufacture a multipole device for use as an ion guide in a mass spectrometer.

Current standard methods for manufacturing multipole devices might employ metal electrodes supported by a plastic (or other insulating) support structure. These methods are generally adequate, although in some cases there is also a requirement to enclose the ion guide structure, e.g. for the purpose of providing a predetermined gas pressure profile in the multipole device. This is normally achieved by enclosing the multipole device in a can or tube.

The present inventors have observed that in the case where a multipole device has segmented electrodes that include many electrode segments (e.g. as might be needed when multiple DC electrodes are used to accelerate ions through a gas pressure), it can be complicated to apply different radiofrequency and DC voltages to the multiple electrodes segments, since multiple individual connections need to be made from voltage sources to the multiple electrode segments.

The present inventors believe it would be desirable to make multiple electrodes part of a single larger assembly to simplify alignment of adjacent electrodes relative to one-another.

U.S. Pat. No. 8,835,839B1 describes an ion manipulation method and device. The ion manipulation device described by U.S. Pat. No. 8,835,839B1 includes a pair of substantially parallel surfaces. An array of inner electrodes is contained within and extends substantially along the length of each parallel surface. The device includes a first outer array of electrodes and a second outer array of electrodes. Each outer array of electrodes is positioned on either side of the inner electrodes, and is contained within and extends substantially along the length of each parallel surface. A DC voltage is applied to the first and second outer array of electrodes. A RF voltage, with a superimposed electric field, is applied to the inner electrodes by applying the DC voltages to each electrode. Ions either move between the parallel surfaces within an ion confinement area or along paths in the direction of the electric field, or can be trapped in the ion confinement area. U.S. Pat. No. 8,835,839B1 indicates that the ion manipulation device can be fabricated and assembled using printed circuit board technology and interfaced with a mass spectrometer. The ion manipulation device is referred to as a Structure for Lossless Ion Manipulation ("SLIM") device. A range of uses are proposed for this SLIM device.

WO2012/150351A1 discloses a device for charged particle transportation and manipulation. Embodiments provide a capability of combining positively and negatively charged particles in a single transported packet. Embodiments contain an aggregate of electrodes arranged to form a channel for transportation of charged particles, as well as a source of power supply that provides supply voltage to be applied to the electrodes, the voltage to ensure creation, inside the said channel, of a non-uniform high-frequency electric field, the pseudopotential of which field has one or more local extrema along the length of the channel used for charged particle transportation, at least, within a certain interval of time, whereas, at least one of the said extrema of the pseudopotential is transposed with time, at least within a certain interval of time, at least within a part of the length of the channel used for charged particle transportation.

In devising the present invention, the present inventors sought to design an ion manipulation device that would permit easy application of different voltages to multiple electrodes, that would provide a simple structure for relatively low manufacturing cost, and a structure that could optionally be enclosed, allowing the gas pressure within the ion manipulation device to be optionally controlled independently of a vacuum chamber optionally containing the device. Note that controlling the gas pressure within an ion manipulation device might be useful if the ion manipulation device is configured as a collision cell, which can be viewed as an area of a mass spectrometer where ions are fragmented by way of collisions with a high pressure background gas. Although given specific nomenclature, a collision cell can also be viewed as an ion guide with a high local gas pressure.

The present invention has been devised in light of the above considerations.

SUMMARY OF THE INVENTION

A first aspect of the invention may provide:
An ion manipulation device for guiding or confining ions in an ion processing apparatus, the device having:
a first circuit board, wherein at least one first electrode for manipulating the path of ions is mounted on a mounting surface of the first circuit board;
a second circuit board, wherein at least one second electrode for manipulating the path of ions is mounted on a mounting surface of the second circuit board;
at least one bridging electrode for manipulating the path of ions, wherein the at least one bridging electrode is mounted to both the mounting surface of the first circuit board and the mounting surface of the second circuit board, wherein the bridging electrode is configured to hold the first circuit board and the second circuit board apart from each other in a fixed spatial relationship in which the mounting surface of the second circuit board faces towards the mounting surface of the first circuit board.

In this way, bridging electrodes for manipulating the path of ions are used to hold the first and second circuit boards (and therefore the first and second electrodes mounted on the first and second circuit boards) in a fixed spatial relationship, without the need for additional structure that is usually needed to hold the electrodes of an ion manipulation device in a fixed spatial relationship.

Preferably, the first and second circuit boards include circuitry for connecting the first, second and bridging electrodes to one or more external voltage sources and/or ground (note that some electrodes may be connected to the same voltage source or each electrode may be connected to a different voltage source and/or ground, depending on requirements).

Preferably, the circuitry for connecting the first, second and bridging electrodes to one or more external voltage sources and/or ground includes conductive elements (e.g. tracks, pads and/or vias) formed on and/or in the first and second circuit boards.

The circuitry for connecting the first, second and bridging electrodes to one or more external voltage sources and/or ground may include electronic components (e.g. capacitors, resistors or active devices) in addition to the conductive elements. However, for the avoidance of any doubt, the circuitry included in the first and second circuit boards may in some embodiments only include conductive elements (e.g. tracks, pads and/or vias) formed on and/or in the first and second circuit boards (without any additional electronic components).

The ion manipulation device may, for example, be an ion guide for guiding ions between structures in an ion processing apparatus, an ion trap or ion store for confining ions within a region of an ion processing apparatus (e.g. for the purposes of cooling the ions), or a fragmentation device for confining and fragmenting ions within a region of an ion processing apparatus.

Preferably, the first circuit board, second circuit board, the at least one first electrode, the at least one second electrode and the at least one bridging electrode extend along a length axis of the device.

Preferably, the first, second and bridging electrodes are arranged around a central chamber of the device.

Preferably, the first, second and bridging electrodes are each configured to receive (respectively) a voltage or connect to ground so that ions are confined in this central chamber when the ion manipulation device is in use.

In some embodiments, the length of the ion manipulation device may be less than 6 times (preferably less than 4 times) the width of the central chamber. This may allow an external electric field to penetrate into the central chamber along the length of the ion manipulation device.

The first, second and bridging electrodes should be spaced apart from each other to avoid electric breakdown when the device is in use.

Preferably, the first, second and bridging electrodes of the ion manipulation device are each configured to receive (respectively) a voltage or connect to ground via circuitry included in the first and second circuit boards when the ion manipulation device is in use.

A voltage received by a first or second or bridging electrode when the ion manipulation device is in use may include a DC voltage and/or an AC voltage, depending on requirements (note that a superposition of a DC voltage and an AC voltage is possible). An AC voltage received by a first/second/bridging electrode may be a radiofrequency AC voltage, which may be referred to as an "RF" voltage herein.

Preferably, the ion manipulation device is a multipole device, with each of the first, second and bridging electrodes being configured to provide (respectively) a multipole electrode, the multipole electrodes being arranged around a central chamber of the device and extending along a length axis of the device. Preferably, each multipole electrode is configured to receive (respectively) an AC voltage (which may be an RF voltage) so that ions are confined in this central chamber when the ion manipulation device is in use.

Preferably, the device includes four, six or eight multipole electrodes. Four or six multipole electrodes (particularly four electrodes) are thought to be easier to implement than eight electrodes, though other numbers of multipole electrodes could be implemented.

For avoidance of any doubt, each multipole electrode could be a segmented electrode (see below).

Preferably, the first circuit board, second circuit board and at least one bridging electrode are arranged circumferentially around a length axis and may optionally be joined together so as to inhibit (preferably to substantially prevent) gas from escaping radially out from the ion manipulation device (radially relative to the length axis) when the ion manipulation device is in use. This may provide an alternative to enclosing the electrodes of the device in a can or tube, if it is desired for the device to contain gas.

Preferably, the first, second and bridging electrodes are configured (e.g. to have sizes and shapes and gaps between) such that the ion manipulation device has a predetermined pressure profile as measured in the direction of the length axis when the ion manipulation device is in use.

One or more of the first, second and bridging electrodes may be a segmented electrode. For the purposes of this disclosure, a segmented electrode includes multiple electrode segments that are separated from each other in the direction of the length axis of the device. As is known in the art, different voltages may be applied to different electrode segments, e.g. to trap charged particles or propel them through the device. Yet the alignment of all electrode segments can be achieved through the mounting of the first, second and bridging electrodes on the first and second circuit boards that are held apart in a fixed spatial relationship by the bridging electrode(s).

The ion manipulation device may be divided into multiple regions, each region having a (respective) length along the length axis of the device. Each region preferably uses the same first and second circuit boards, but may have its own first, second and bridging electrodes. The first, second and bridging electrodes in each region may have different shapes (e.g. have a more-open structure or a more-closed structure, as discussed below), yet the alignment of the electrodes in the different regions can be achieved through the first and second circuit boards being held apart in a fixed spatial relationship by the bridging electrode(s).

For avoidance of any doubt, each region may include segmented electrodes.

The ion manipulation device may include:
  a first region having a first length along the length axis of the device, wherein the first region of the device viewed in cross section perpendicular to the length axis encloses a first area unoccupied by electrodes;
  a second region having a second length along the length axis of the device, wherein the second region of the device viewed in cross section perpendicular to the length axis encloses a second area unoccupied by electrodes;
  wherein the second area is larger than the first area.

In this way, the second region of the ion manipulation device has a more-open structure than the first region of the ion manipulation device. This means that the first and second regions of the ion manipulation device can be configured so that the ion manipulation device has a predetermined pressure profile as measured in the direction of the length axis, without necessarily having to use a plate with an aperture (or several such plates).

For avoidance of any doubt, the device may include multiple first and/or second regions arranged in any order along the length axis.

In some embodiments, the ion manipulation device may include:
- a first region having a first length in the direction of the length axis of the device, wherein the first region of the device viewed in cross section perpendicular to the length axis encloses a first area unoccupied by electrodes;
- a second region having a second length in the direction of the length axis of the device, wherein the second region of the device viewed in cross section perpendicular to the length axis encloses a second area unoccupied by electrodes;
- a third region having a third length in the direction of the length axis of the device, wherein the third region of the device viewed in cross section perpendicular to the length axis encloses a third area unoccupied by electrodes;
- wherein the second region is between the first and third regions;
- wherein the second area is larger than the first and third areas.

In this way, the second region of the ion manipulation device has a more-open structure than the first and third regions of the ion manipulation device. This means that the first and third regions can act to constrain gas within the second region without necessarily having to use a plate with an aperture (or several such plates). In other words, the first, second and third regions of the ion manipulation device can be configured so that the ion manipulation device has a predetermined pressure profile as measured in the direction of the length axis, without necessarily having to use a plate with an aperture (or several such plates). This might be useful e.g. if the device is to be used as a collision cell.

The ion manipulation device may include one or more gas inlets configured to allow gas to be pumped into the ion manipulation device from one or more external gas sources (e.g. a gas pump). The one or more external gas sources may be included in the ion processing apparatus).

The first and second circuit boards may each include (respectively) an insulating substrate. Each insulating substrate may be made of a standard circuit board material, e.g. FR-4.

Preferably, the insulating substrate is manufactured from a material chosen to match the properties of the electrical waveforms applied to the device and the physical requirements. For example, a suitable dielectric constant could be chosen to match the applied voltages. Preferably, the dissipation factor discussed below represents just one parameter in a group of parameters used to select the insulating material. This group may include electrical properties (e.g. dielectric constant, dissipation factor, volume and surface resistivities) and physical properties (e.g. thermal expansion coefficient, Young's modulus, tensile and flexural strength, thermal conductivity, moisture absorption, outgassing properties).

By way of example, each insulating substrate is preferably a substrate with a low dissipation factor, since a low dissipation factor substrate has been found to be less susceptible to heating that can be caused from currents flowing through conductive elements on/in the circuit boards to supply the first/second/bridging electrodes with voltages needed for a typical ion manipulation application, e.g. as might be needed in an ion processing apparatus such as a mass spectrometer. An insulating substrate with a low dissipation factor might, for example, be a PTFE-based substrate or a ceramic substrate.

A ceramic insulating substrate may advantageously provide a low dissipation factor as well as improved assembly tolerances, as discussed below. Thus, the first and second circuit boards may each include a ceramic insulating substrate.

As a skilled person would appreciate, the PCB may be manufactured according to present PCB manufacturing good practices, e.g. by allowing sufficient clearance between components or tracks, sufficient spacing between holes etc.

The first and second circuit boards may conveniently be printed circuit boards ("PCBs") on which conductive elements are formed, e.g. by printing/etching a conductive layer on an insulating substrate. The printed circuit boards could be single sided (one conductive layer), double sided (two conductive layers), or multi-layer (three or more conductive layers).

The first and second circuit boards may include one or more dedicated alignment features, such as dowel holes, for use in aligning the first and second circuit boards in the fixed spatial relationship, which may be a predetermined fixed spatial relationship. Corresponding alignment features, such as dowels, may be included on the electrodes.

The first, second and/or bridging electrodes may be attached to the first and second circuit boards using fasteners, such as screws, and mounting features (such as screw holes) in the first and second circuit boards. Fasteners may also be used to hold the first and second circuit boards in the fixed spatial relationship (either alone or preferably in conjunction with dedicated alignment features).

The first and/or second circuit boards may include a cantilever portion which extends out from the device beyond an envelope that encloses the first, second and bridging electrodes. The first and/or second circuit boards may include two cantilever portions, each cantilever portion extending out from the device beyond an envelope that encloses the first, second and bridging electrodes.

The device may include a member located on an outer-facing surface of the at least one bridging electrode, e.g. to restrict gas flow out from the device. The member may be an electrical insulator.

A second aspect of the invention may provide an ion processing apparatus including an ion manipulation device according to the first aspect of the invention.

The ion processing apparatus may include one or more voltage sources, wherein one or more of the first, second and bridging electrodes of the ion manipulation device are configured to receive a voltage from the one or more voltage sources (note that one or more of the first, second and bridging electrodes may be configured to connect to ground rather than receive a voltage from the one or more voltage sources).

The one or more voltage sources may include one or more AC voltage sources and/or one or more DC voltage sources.

The ion processing apparatus may include one or more gas pumps.

The ion processing apparatus may be a mass spectrometer.

A third aspect of the invention may provide a method of manufacturing an ion manipulation device according to the first aspect of the invention.

The method may include mounting the at least one bridging electrode to both the mounting surface of the first circuit board and the mounting surface of the second circuit board, so that the bridging electrode holds the first circuit board and the second circuit board apart from each other in a fixed spatial relationship in which the mounting surface of the second circuit board faces towards the mounting surface of the first circuit board.

The invention also includes any combination of the aspects and preferred features described except where such a combination is clearly impermissible or expressly avoided.

BRIEF DESCRIPTION OF THE DRAWINGS

Examples of these proposals are discussed below, with reference to the accompanying drawings in which.

DETAILED DESCRIPTION

Figure 1:
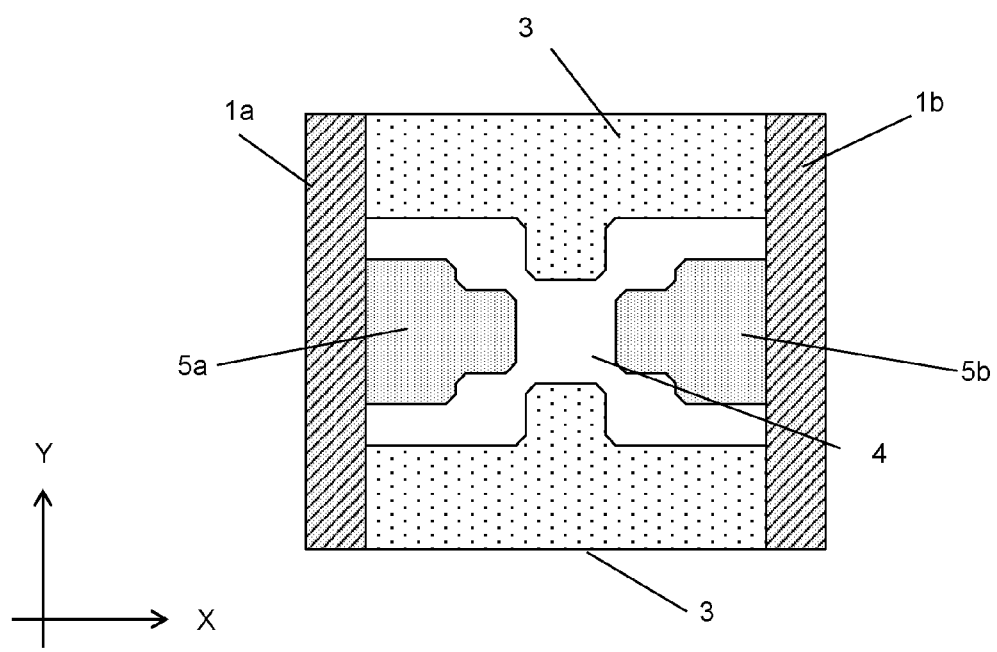
FIG. 1 shows an end view of a first PCB-based multipole device in the XY plane.

In general, the following discussion describes examples of our proposals that provide a multipole device for use e.g. as an ion guide, and a method of manufacturing such a device using printed circuit boards in a 'sandwich' construction method. The method, in which PCBs are used to manufacture a multipole device having supporting electrodes and electrical connections, is capable of producing a relatively low cost, moderate accuracy multipole device which may be suitable for employment in a mass spectrometer.

Unlike the devices proposed by U.S. Pat. No. 8,835,839B1, the example multipole devices described below can readily be utilised to provide a gas conductance restriction.

Further, in the example multipole devices described below, the electrodes themselves act to separate the two PCBs using what we have described as "bridging" electrodes. Hence the electrodes included in the example devices described below help to provide an integral part of the alignment and assembly method in the multipole device proposed herein. In U.S. Pat. No. 8,835,839B1, further support or mounting pieces would be required to space the planar surfaces apart, arguably adding complexity. A further distinction between the multipole devices described below and the SLIM devices proposed by U.S. Pat. No. 8,835,839B1 is that the SLIM devices proposed by U.S. Pat. No. 8,835,839B1 do not form a multipole device, instead containing ions by way of a pair of 'RF carpet'-like surfaces with DC 'guard' potentials applied to electrodes at the side. This approach differs somewhat from the standard RF multipole ion guide approach and as such the SLIM devices proposed by U.S. Pat. No. 8,835,839B1 cannot be considered as multipole devices, when considered in view of the well-known theory which characterises multipole devices (quadrupoles, ion traps etc).

In some embodiments, multipole device may be defined as a device having 2n parallel electrodes extending along an axis (n=2, 3, 4, . . . ). An exact field potential for a multipole consisting of 2n electrodes may be calculated by solving analytically the well-known Laplace equation. In use, a multipole consisting of 2n electrodes may generate a two-dimensional oscillatory electric field having 2n poles. The number of pairs of poles n=2, 3, 4, . . . may be chosen arbitrarily, and hence there is a whole family of possible multipole electrode arrangements. The quadrupole (n=2), which is most commonly employed, represents only the first member of this family of multipole devices. Substitution of the boundary conditions yields exact formulae for the electrode geometry that correspond to various values of n. In practical devices the exact electrode geometry may deviate from such formulae, e.g. to provide an approximate representation of the formulae. Such practical devices with n poles may have small amount of field components characterising higher orders. A multipole device may deviate from the exact field for convenience of manufacture or to achieve particular ion optical properties, for example.

A high order multipole device, for example n=6, may be used to create a field of a lower order device e.g n=2 by appropriate application of the RF voltages.

For the purpose of this patent multipole device preferably includes all such devices.

The multipole devices described below may be used e.g. for ion transport, ion trapping, ion cooling and/or ion fragmentation in an ion processing device such as a mass spectrometer.

Advantages of the multipole devices described below may include:

Provision of a simple, low cost to manufacture ion guide.

Simple assembly procedure.

No alignment jig required.

Easy and reliable connection of voltages to electrodes using conductive elements (e.g. tracks) within the PCBs.

The 'sandwich' construction allows the ion guide either to be enclosed (such as in applications where it is desired that gas is enclosed within the device) or holes may be added to the PCB to allow gas to move freely into/out of the device.

The multipole devices described below can be manufactured using printed circuit boards ("PCBs") as a support structure for the electrodes of the multipole device. In this way, the PCBs can have three functions:
1) support of electrodes for manipulating the path of ions.
2) carrying conductive elements for connecting the electrodes to one or more external voltage sources and/or ground
3) (optionally) containing gas within the multipole device.

Conventionally, each of these functions would generally be carried out by separate structures. For example plastic support pieces would be used to hold the electrodes, wires would be used to make electrical connections and a surrounding 'can' would be used to contain gas. Using the PCBs and electrodes to perform the three functions leads to fewer components, as well as simplified assembly and manufacture. Manufacture of PCBs in large quantities is an inexpensive process, and so the devices can be made at a lower cost.

Additionally, a large advantage of the multipole devices described below is that multiple electrode segments can be simply combined into a single structure, whilst allowing for electrical connections to be made simply and with high reliability. With conventional manufacturing methods, each electrode segment would need to be individually supported and aligned to adjacent electrode segments, whereas using the current method, this alignment is simple as the PCB support structures can extend to support all electrode segments of the multipole device. This allows ion guide structures containing many electrodes to be manufactured easily, as well as simplifying making electrical connections to the multiple electrodes.

Use of PCBs to enclose the ion guide structure may help to avoid the requirement for separate enclosing structure, reducing the number of required components.

However, holes may optionally be cut in the PCB material to allow gas to escape/enter the device, meaning that containing gas is an optional feature.

For ease in this description the multipole devices are generally referred to as ion guides. However, the multipole devices could equally be used as an ion store, an ion trap, a collision cell etc (indeed any application which might employ a standard quadrupole or multipole ion guide).

An ion guide may be simply manufactured using PCB support structures according to the following approach. A pair of PCBs may be placed on either side of a set of electrodes such that the electrodes are supported by one or both PCBs. The use of dedicated alignment features such as dowels and dowel holes and/or mounting features such as screw holes may be included in the PCBs and/or the electrodes to allow the electrodes to be mounted to the PCBs.

With reference to FIG. 1 showing and end view of a first PCB-based multipole device in the XY plane, the basic structure includes:
First and second printed circuit boards ("PCBs") 1a, 1b;
Bridging electrodes 3 configured to bridge between the two PCBs and mounted to both PCBs;
Side electrodes 5a, 5b that include a first electrode 5a mounted to the first PCB 1a and a second electrode 5b mounted to the second PCB 1b.

The first, second and bridging electrodes 3, 5a, 5b are arranged around a central chamber 4 of the device.

Figure 4:
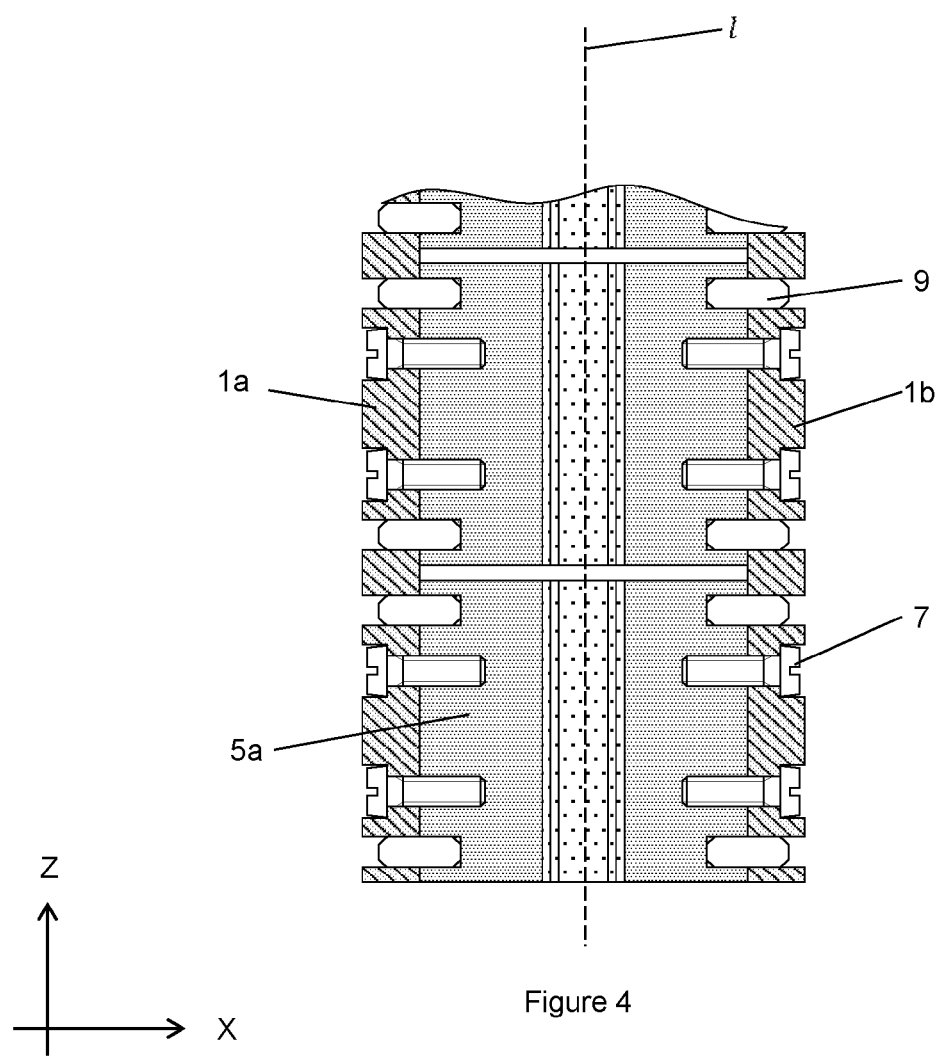
FIG. 4 shows a cross sectional view through the second PCB-based multipole device in the XZ plane showing fasteners and dowels.

The first PCB 1a, second PCB 1b, bridging electrodes 3, first electrode 5a and second electrode 5b all extend along a length axis l (not shown in FIG. 1, but this axis is parallel to the z-axis with the first circuit board 1a, second circuit board 1b and bridging electrodes 3 being circumferentially arranged around the length axis, see e.g. FIG. 4).

As well as holding the first circuit board 1a and the second circuit board 1b apart from each other in a fixed spatial relationship, the bridging electrodes 3 may additionally provide an electric connection from one circuit board to the other, which might be useful e.g. if the same voltage is to be applied to electrodes on both circuit boards 1a, 1b.

In the first PCB-based multipole device shown in FIG. 1, the electrodes 3, 5a, 5b are configured to produce a quadrupole or quadrupole-like electric field in the centre of the device when appropriate radiofrequency voltages are applied to the electrodes 3, 5a, 5b. The device may be made to have a central chamber 4 with any appropriately chosen inscribed radius by altering the size of the electrodes 3, 5a, 5b and the PCBs 1a, 1b. Additionally, the electrodes 3, 5a, 5b can take any reasonable shape, both on their 'active' surface and the auxiliary or mounting surfaces. The 'active' surfaces of the electrodes 3, 5a, 5b are shown in all examples given here as flat, but could take any shape such as rounded, hyperbolic etc. The auxiliary surfaces of the electrodes 3, 5a, 5b may be altered to suit the application or mounting requirement of the device, for example the requirement to enclose gas or allow free circulation, or to allow appropriate voltage tracking distances to be employed. The device does not need to take the form of a quadrupole: it is possible to manufacture other multipoles having a different number of multipole electrodes by a similar method, see e.g. FIG. 8.

Figure 2:
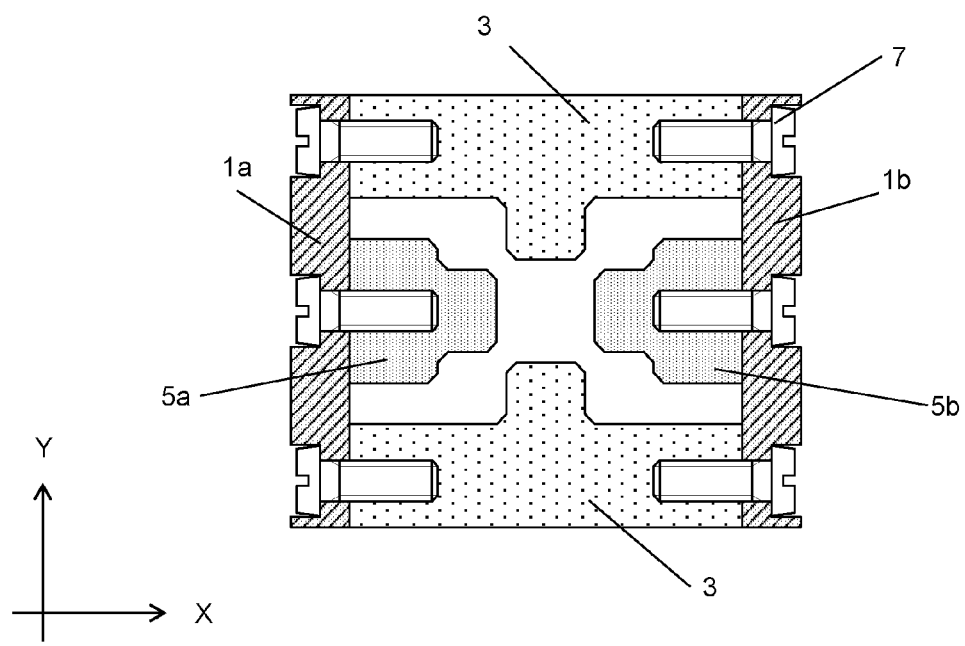
FIG. 2 shows a cross section of the first PCB-based multipole device showing fasteners in the XY plane.

The construction and alignment strategy of the first PCB-based multipole device is shown in FIG. 2.

Figure 3:
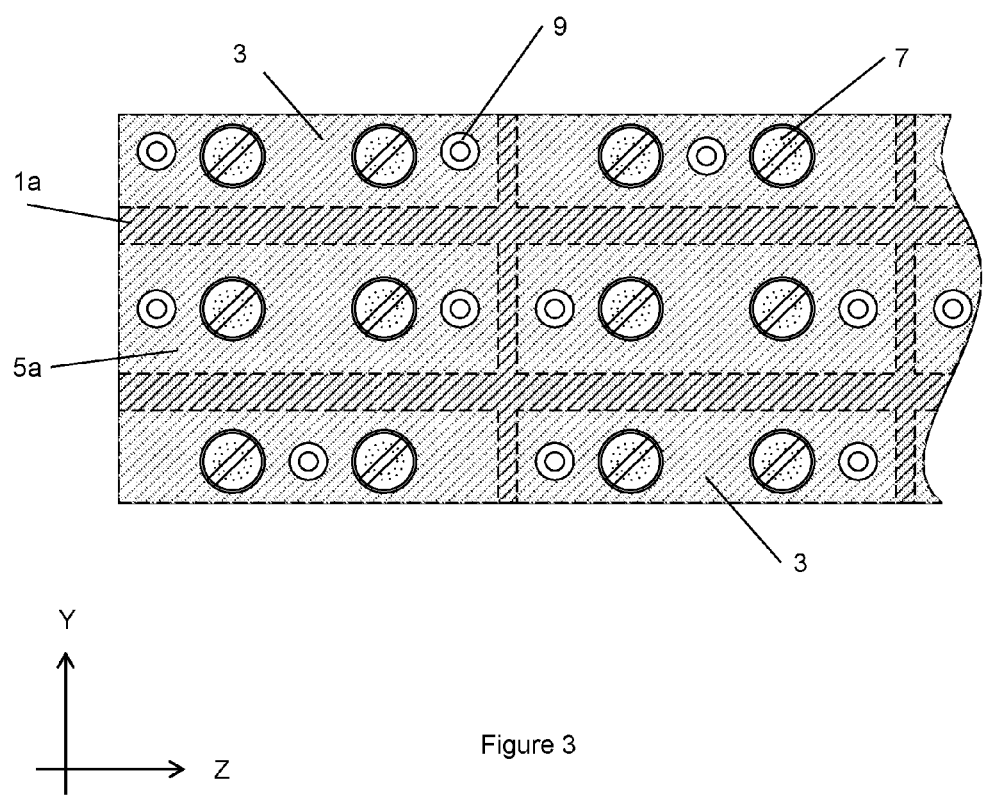
FIG. 3 shows a view of a second PCB-based multipole device in the YZ plane from the PCB side showing fasteners and dowels. Locations where the electrodes are in contact with the PCB are marked with dashed lines.

FIGS. 3 and 4 show the construction and alignment strategy of the second PCB-based multipole device. FIG. 4 also shows a length axis l of the device, which extends in the direction of the z-axis.

In the examples shown in FIGS. 2, 3 and 4, all electrodes are screwed to either one or both PCBs 1a, 1b. The bridging electrodes 3 configured to 'bridge' between the two PCBs 1a, 1b. The first electrodes 5a are configured to be mounted to the first PCB 1a. The second electrodes 5b are configured to be mounted to the second PCB 1b. Fasteners, in this case screws 7, are used for mounting the electrodes 3, 5a, 5b to the PCBs 1a, 1b. The screws 7 may optionally be countersunk into the PCBs 1a, 1b so as not to disturb the outer profile of the structure. Alignment of the electrodes 3, 5a, 5b in the YZ plane may be achieved by way of dowels 9 and dowel holes. In this example, screws 7 are not used for the purpose of performing alignment of the electrodes, although it is conceivable that the screws 7 could perform a crude alignment function (e.g. without the need to use dowels) in cases where tight tolerances are not needed. An appropriate number of dowels 9 may be chosen for each electrode to ensure that the electrode is appropriately aligned/constrained. For example, the side electrodes 5a, 5b mounted to a single PCB 1a, 1b may utilise two dowels 9 to locate the electrodes 5a, 5b in the YZ plane. Bridging electrodes mounted to both PCBs 1a, 1b may utilise 3 or more dowels 9 to align the electrodes in the YZ plane. For example two dowels may be placed in one PCB with a single dowel in the other PCB. The number and location of dowels for each electrode should be chosen according to the structure of the full assembly, and should be undertaken according to general manufacturing good practice. Note that each PCB 1a, 1b may optionally incorporate alignment features on a surface opposite to the mounting surface for the electrodes 3, 5a, 5b, e.g. to align the full assembly into a larger ion processing apparatus, such as a mass spectrometer.

Those skilled in the art will realise that the size of the bridging electrodes 3 in the x dimension will define to some extent the separation of the side electrodes 5a, 5b along with the size of the side electrodes 5a, 5b in the x dimension. This method relies to some extent on the substrate of each PCB 1a, 1b being sufficiently stiff so as not to distort the dimensions of the device. The material and thickness of the substrate of each PCB 1a, 1b is therefore preferably chosen to be appropriately thick to avoid distortion. The substrate of each PCB 1a, 1b is preferably screwed to the bridging electrodes 3, which preferably serve to strengthen the device as the bridging electrodes 3 may be chosen to be made sufficiently large and sturdy to reduce the impact of any PCB distortion. The location of all electrodes 3, 5a, 5b in the y dimension may be achieved by way of dowels 9.

The holes for location of the dowels on both the electrodes 3, 5a, 5b and the PCB 1a, 1b are preferably toleranced to achieve appropriate assembly tolerances. Standard PCB manufacturing technology generally achieves good hole-to-hole tolerances. The limit of the hole-to-hole positional tolerances may be around 10 micrometres using standard PCB manufacturing methods, which defines the overall assembly tolerances which may be achieved. The dimensions of the electrodes 3, 5a, 5b could be toleranced to much smaller values (for example 2 micrometres), but it may be preferably for appropriate manufacturing tolerances to be chosen to match the tolerances achievable by the standard PCB manufacturing method. Note that it may be possible to manufacture the PCBs 1a, 1b using ceramic-based substrates and non-standard PCB manufacturing methods to achieve improved overall assembly tolerances. A preferred aim of the invention, however, is to produce a low-cost and simple to assemble device which can utilise standard low-cost PCB manufacturing techniques and standard PCB materials such as, for example FR-4 material. An appropriate PCB material may nonetheless be chosen according to the desired vacuum and electrical properties. For example, the PCB material may be chosen to avoid undue heating caused by RF electric fields present when the device is in use. It should be noted that the PCB material may be single, double or multi-layered, and may incorporate tracks, vias, etc within the PCB, as in any standard PCB manufacturing method.

Within the bounds of the basic structure described above, the electrodes 3, 5a, 5b could be changed in profile in a virtually infinite number of ways to produce alternative ion guide geometries. The second PCB-based multipole device shown in FIGS. 3 and 4 show an ion guide device in which the first electrode 5a and the first, second and third electrodes 3, 5a, 5b are each provided by a segmented electrode consisting of multiple electrode segments (only the electrode segments for the first electrode 5a and the bridging electrodes 3 are shown in FIG. 3). This may be desirable when there is a requirement to apply different voltages to different sections of the ion guide to trap charged particles or propel them through the device. These different voltages may be DC voltages used to offset the trapping RF waveforms (see below) or may be different radiofrequency waveforms. The device structure proposed herein is particularly suited to use where there are multiple electrode segments as the alignment of all electrode segments is achieved due to doweling of the electrodes 3, 5a, 5b to the same PCBs 1a, 1b, meaning that different electrode segments may be easily aligned within a single assembly structure. However, the device structure proposed herein is equally applicable to devices for having elongated electrodes which extend the full length of the PCB assembly. The practical limit for the length of an electrode may be defined by the desired tolerances, the 'wieldiness' of the structure and the manufacturing capability for both PCBs and electrodes. It is conceivable to manufacture PCBs with dimensions in excess of 1 meter squared, so it is envisaged that a device as proposed herein could have a length of 1 meter or more (although a length of 1 meter or more could result in the device being flexible, so might not be useful for applications having tight tolerances). A lower limit for the length of an electrode in the direction of the length axis is likely to be defined by the size of the fasteners and space to integrate alignment features into the electrode/PCB materials. Using M1.6 fasteners and M1.6 dowels it is conceivable to employ electrode segments of length less than 10 mm, but with other types of fastener (e.g. through soldering) it may be possible to use electrode segments having a length that is smaller than 10 mm. A reasonable lower limit may be an electrode segment length of 5 mm. Consequently, the preferred length L of the electrodes in the direction of the length axis may be 5 mm<L<1000 mm, more preferably 7 mm<L<500 mm, more preferably 10 mm<L<300 mm and more preferably 10 mm<L<50 mm.

An important feature of any multipole device could be considered to be the inscribed radius of the electrodes, which may be defined as the half-distance between opposing electrodes in these examples. This inscribed radius may be chosen according to the desired properties of the multipole device, the applied voltages, the properties of ions to be transported etc. Consequently, the inscribed radius will be chosen to suit the application. With respect to the size of the ion guide structure in the XY plane and hence the inscribed radius, this is likely to be limited by the magnitude of the applied voltages (to avoid voltage breakdown) and the manufacturing techniques at the smaller limit, and the available manufacturing techniques at the larger limit. An appropriate lower limit for the inscribed radius might be 0.5 mm, with an appropriate upper limit of say 100 mm. Consequently, a preferred inscribed radius r of the electrodes is 0.5 mm<r<100 mm, more preferably 1 mm<r<50 mm, and more preferably 2.5 mm<r<10 mm.

Note that not all electrode segments of the ions guide are required to have the same length in the Z direction or inscribed radius, and indeed it may be desirable to have electrode segments having different lengths and/or different inscribed radiuses disposed along the z-axis to provide different functions.

A 'rule-of-thumb' is that an electric field will penetrate into an aperture by a distance that is approximately 6 times the inscribed radius of (3 times the inscribed diameter of) the aperture radius. Consequently, if it is desirable to have an electric field penetrate into the central chamber 4 (which may be referred to as the ion guide aperture) (for example, a DC field may be used to urge ions along the axial length of the ion guide), it may be desirable to ensure that the length of the relevant electrode segment of the multipole device is less than six times the inscribed diameter (12 times the inscribed radius) to ensure that electric fields may penetrate into the electrode segment from both ends of the electrode segment, to urge ions along the device. If this is the case, the preferred length of an electrode segment l may be chosen to be equal to or less than 4 times the inscribed diameter of the device d, that is less than 8 times the inscribed radius r.

An advantage of the manufacturing method is that it is simple to apply many different voltages to different electrodes or electrode segments, as the conductive elements formed on/in the PCBs 1a, 1b may be used to carry voltage signals to the electrodes 3, 5a, 5b. PCBs are especially suited to this task as the technology has been developed specifically for this application, and so provides a convenient method to route different voltages simply and reliably and with a fixed capacitance. For example, an ion guide assembly with 10 different segments may have, say, 20 different voltage waveforms to be applied to the electrodes. Conventional wiring would be more difficult in this scenario, and would be susceptible to mistakes.

Fasteners could be configured to apply voltages to the electrodes 3, 5a, 5b. For example, if the screws are manufactured from a conducting material, electrically conducting tracks within the PCBs may intercept the screws, to allow the screws to make an electrical connection to the electrodes. A 'pad' on the surface of the PCB (or within a countersunk hole) may be used to ensure good contact with the screw head, with the screw body making the electrical contact to the electrode. An alternative method is to use a metalized pad (e.g. gold plated copper) on the surface of the PCB closest to the electrode to make electrical contact with the electrode. Note that, as there are two PCBs 1a, 1b, different electrical tracks can be routed in different PCBs 1a, 1b. In some cases, voltage waveforms may need to be passed between the PCBs 1a, 1b, which may be achieved simply by using a bridging electrode 3 or wire links.

A further advantage to using PCB material as a core part of the structure of the proposed devices is that electronics components may be mounted onto the PCB material with little additional cost and effort, allowing great flexibility in the way voltage waveforms are manipulated. For example, the use of capacitors and resistors on the PCB material may allow the combination of an RF signal with several different DC voltages, to produce an ion guide with several electrode segments to which the same RF potential is applied, but with different DC offset potentials applied to each electrode segment. In this way, a very flexible electrode assembly can be produced whilst reducing the requirement for additional wires to the assembly. An example is a segmented electrode having 10 electrode segments, each with the same RF and each with different DC offset voltages applied thereto. In the case where no electronics components are employed on the ion guide, 20 different connections to the assembly might be required (RF+ and RF− for each of the 10 electrode segments, each with different DC offset voltage). In the case where electronics components are employed on the PCBs, as few as 12 connections to the assembly might be required (RF+, RF− and 10 DC offset voltages) where the RF and DC offsets are combined on the PCBs by way of the electronics components. If several DC offsets have defined, unchanging ratios, this can be reduced still further by use of resistor chains on the PCBs.

There are several modifications which may be made to the structure of the device to achieve different goals. These include, but are not limited to: altering the electrode structure to modify the gas flow properties of the device; employing additional 'packing' pieces to seal the device to gas ingress/egress; employing holes in the electrodes or PCBs to allow gas ingress/egress; and extending the PCB beyond the envelope of the electrodes to allow mounting areas or mounting of electronics components or connections.

The device shown in FIG. 1 has a comparatively open electrode structure. Gas within the ion guide could be freely pumped from the end of the device and flow freely around the electrode segments.

Figure 5:
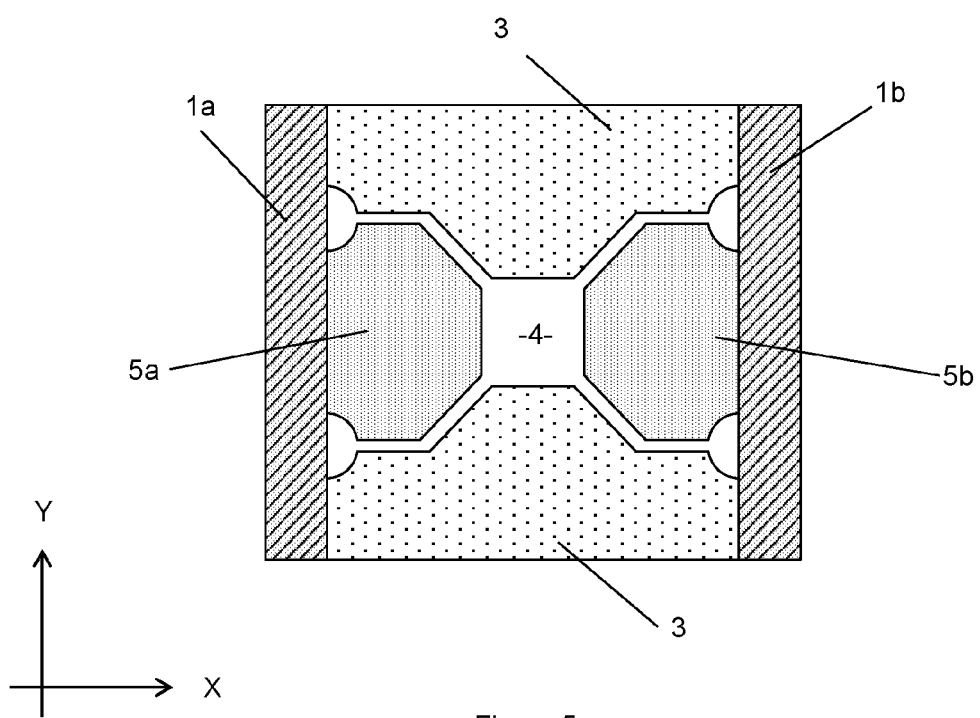
FIG. 5 shows an end view in the XY plane of a third multipole device having reduced open area between electrodes.

FIG. 5 shows an end view in the XY plane of a third multipole device having reduced open area between electrodes (i.e. a reduced area unoccupied by electrodes).

The electrodes 3, 5a, 5b as shown in FIG. 5 has a more-closed structure compared with the device of FIG. 1. In this case, the shapes of the electrodes 3, 5a, 5b have been modified such that the gaps between the electrodes are considerably reduced (but note that some gap is required so that the electrode can have different voltages applied thereto). In other words, when viewed in cross section perpendicular to the length axis (z-axis) of the device, the area enclosed by the device of FIG. 5 unoccupied by electrodes is smaller than that enclosed by the device of FIG. 1. In this manner, the largest aperture for gas flow into/out of/around the device is the central chamber 4 formed by the electrode active faces themselves, which in this case is a largely square aperture. While the residual gaps between the electrodes 3, 5a, 5b does have some area through which gas might escape, this is much reduced compared to the more-open structure shown in the device of FIG. 1. This would considerably restrict the flow of gas out of/in-to the device in the central chamber 4. Note that the structure as shown in FIG. 5 also employs circular section cut-outs in the electrodes 3, 5a, 5b where the electrodes 3, 5a, 5b meet the PCBs 1a, 1b adjacent to the other electrodes. Such a technique may be employed to reduce the surface-tracking distance (distance at which breakdown occurs across a surface) between adjacent electrodes 3, 5a, 5b to reduce the possibility of voltage breakdown between electrodes 3, 5a, 5b.

A further feature of the device is that the electrodes may be configured with one or more gas inlets, which may be cut-outs or holes that allow gas to be supplied to a region, or alternatively, pumped out. This may be applied to multiple electrode segments if required.

In this way, the device can be configured to have regions having more-open and more-closed electrode structures, where gas might be constrained within a region having a more-open electrode structure by the regions having a more-closed electrode structure. Gas may be supplied to the region having a more-open electrode structure for example, to generate a region of elevated pressure. One example application for such a device might be a collision cell, where an elevated pressure could be employed in the region having a more-open electrode structure, with the regions having a more-closed electrode structure being used to reduce gas loss through the ends of the device, hence generating a pressure gradient. In this way, a region of elevated pressure may be generated without requirement for the use of plates with small apertures, which is generally employed in the art as the 'de-facto' method to reduce gas flow and hence retain gas in an elevated pressure region of a multipole device.

Figure 6A:
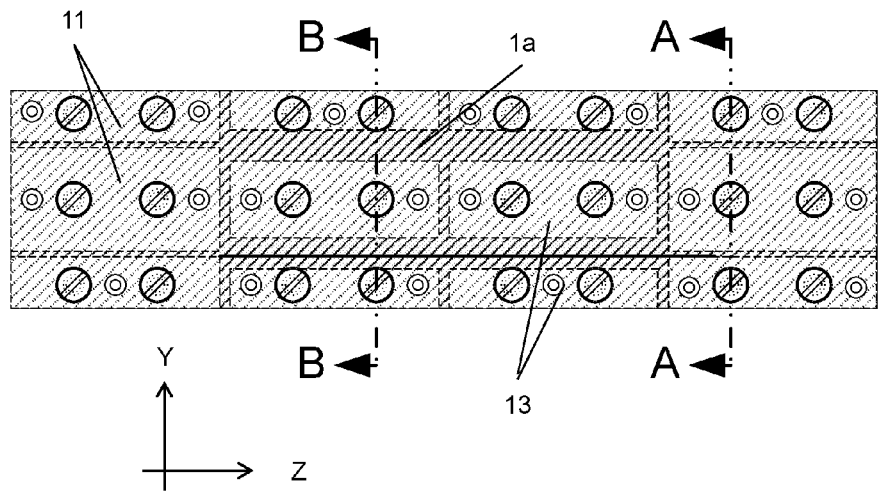
FIG. 6A shows a view of a fourth multipole device incorporating a more-open structure region and more-closed structure regions.
Figure 6B:
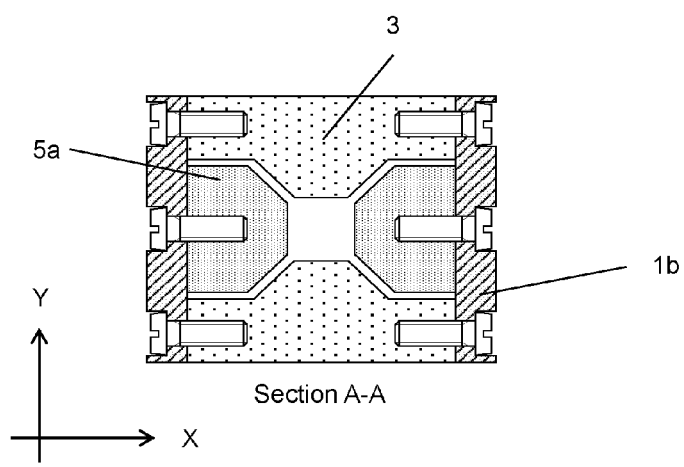
FIG. 6B shows the more-closed structure region of the fourth multipole device as viewed in cross section along the line A-A in FIG. 6A.
Figure 6C:
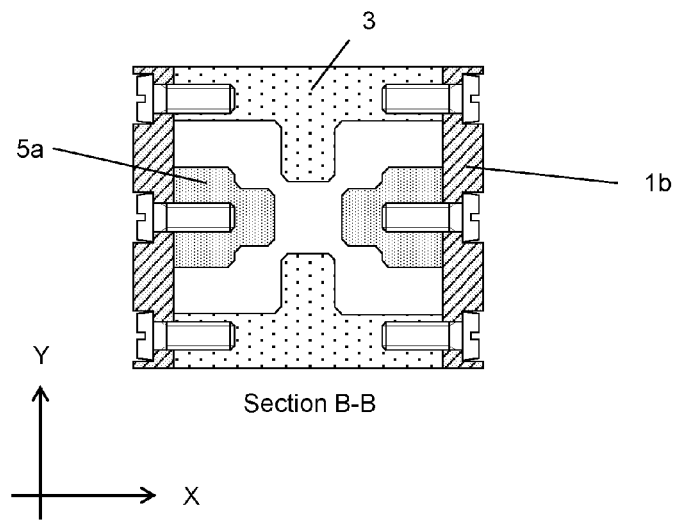
FIG. 6C shows one of the more-open structure regions of the fourth multipole device as viewed in cross section along the line B-B in FIG. 6B.

This is demonstrated by FIGS. 6A-6C which includes regions 11 having a more-closed electrode structure at the ends of the device and a region 13 having a more-open electrode structure in the centre of the device. FIG. 6B shows the more-closed structure regions 11 by way of cross section A-A in FIG. 6A. FIG. 6C shows the more-open structure region 13 by way of cross section B-B in FIG. 6A. In this way, by employing a gas inlet (typically a hole—not shown) into the assembly in the more-open region 13, the more-open region of the device may be maintained at an elevated pressure with respect to the more-closed structure regions 11 either side of the more-open region 13 or further regions beyond the device. Such a device may be suitable for use as a collision cell for example.

The conventional use of plates with small apertures to generate elevated pressure has some disadvantages, in that there exist so-called 'fringe field effects' in the region of the aperture and plate. The electric field within the device may be disturbed by the effects of the aperture. Charged particles can easily be lost from the device in this region, reducing sensitivity. By utilising the electrodes of the multipole device to reduce gas flow instead of a plate with an aperture (i.e. by using the more enclosed structure), these fringe field effects could be minimised or removed entirely, with a commensurate reduction in charged particle loss. This may lead to an improvement in sensitivity for example.

Pressure regimes where the mean free path of background gas molecules is of the order of (or longer than) the dimensions of the system, termed the molecular flow regime, are often employed in charged particle devices. At such pressures, the gas flow properties may be determined using simple theory. The pressure differential between two adjacent pressure areas may be defined as a relationship of the fluid conductance C between the two regions: the fluid conductance is a measure of the pumping speed between the two regions, in volumes per unit time, generally given in $m^3 s^{-1}$ or $Ls^{-1}$. A larger fluid conductance results in a larger flow between the two volumes. In order to maintain a larger pressure differential between two volumes (assuming there is some net flow of gas into one of the two regions, e.g. from a pipe to a gas source), the fluid conductance should be made smaller. To reduce the pressure differential between two volumes the fluid conductance should be made larger, all other things being equal. Hence to maintain a larger pressure differential, a region of reduced fluid conductance is required.

It is well known from theory (see "A Users Guide to Vacuum Technology, Third Edition, J. F. O'Hanlon, Wiley, New York" pages 32-34) that, to a first approximation in the molecular flow regime, the conductance of an orifice in a plate $C_{hole}$ is given by:

$$C_{hole} = \frac{v}{4}A = \frac{v}{4}\pi r_{hole}^2$$

Where v is the average velocity of the gas, A is the areas of the hole and $r_{hole}$ is the radius of the hole. Hence for an aperture in a plate the conductance may be changed by changing the area or radius of the hole. For a long round tube, this conductance $C_{tube}$ becomes:

$$C_{tube} = \frac{\pi}{12}v\frac{d_{tube}^3}{l} = \frac{\pi}{12}v\frac{(2r_{tube})^3}{l}$$

Where v is the average velocity of the gas, $d_{tube}$ is the diameter of the tube, $r_{tube}$ is the radius of the tube and l is the length of the tube.

To a first approximation, a closed-section electrode structure 11 of the device shown in FIGS. 6A-C may be approximated to be a long tube (better approximations are possible, but this approximation serves the purpose of demonstrating the principle of operation: the reader may extend the theory to a more accurate description of the gas flow properties of the structure if desired). If it is desired to make the conductance of the electrode structure equal to the conductance of a round orifice in a plate, $C_{hole}$ and $C_{tube}$ may be set equal to one another, giving a range of tube geometries (of diameter and length) which would meet the criteria.

It can also be easily seen that increasing the length of a region of the device shown in FIG. 6A-C allows a larger diameter 'tube' whilst retaining the same conductance i.e. the electrode-to-electrode separation may be increased, and hence a pressure differential may be maintained between the interior and exterior of the device. In this way, by setting the closed-structure region(s) 11 to a particular length, a desired fluid conductance can be achieved, and hence a desired gas pressure differential can be maintained between the interior and exterior of the device without the use of plates with apertures. Note that, as the fluid conductance scales with the cube of the diameter and only inversely to the length, especially large diameters become quickly impractical, as a very long tube length would be required to compensate for the large tube diameter whilst retaining the same gas conductance. But within a relatively small range (from e.g. diameters up to around 5 or 10 mm), the required lengths can remain in a practical range, depending of course on the desired fluid conductance. Note that a closed-section region(s) 11 might employ multiple electrode segments in series to increase the overall length of the closed-section region(s) 11 whilst retaining the functionality of multiple electrode segments, such as the ability to apply different DC offset voltages to each segment.

Figure 7:
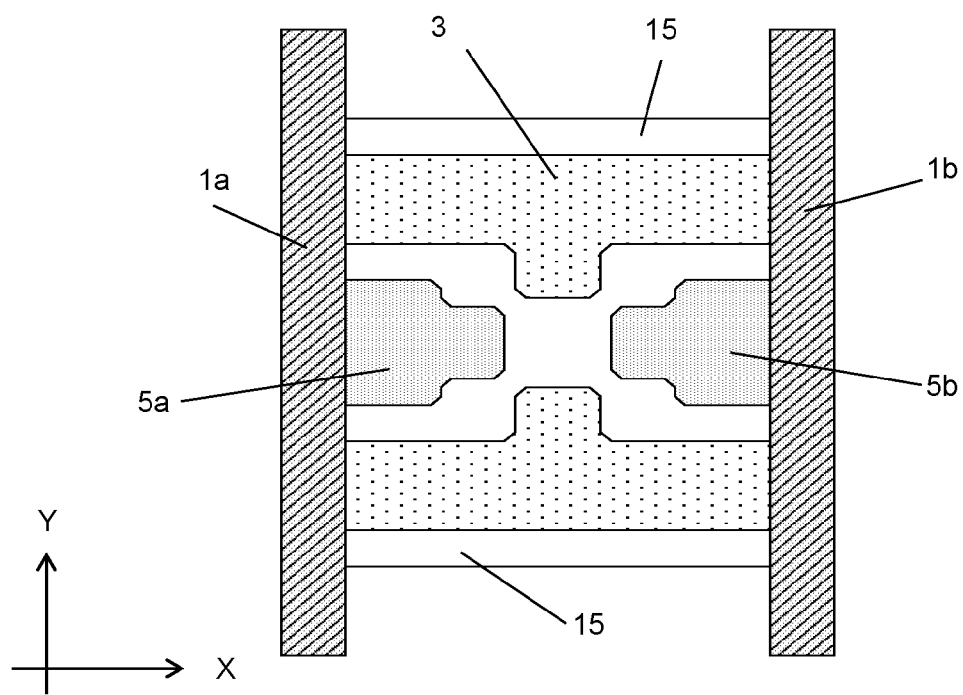
FIG. 7 shows an end view in the XY plane of a fifth multipole device which incorporates PCBs which extend beyond the envelope of the electrodes and incorporates additional enclosing material 15.

FIG. 7 shows an end view in the XY plane of a fifth multipole device which incorporates PCBs which extend beyond the envelope of the electrodes and incorporates additional enclosing member 15. Thus, in FIG. 7 a member 15 is shown adjacent to the bridging electrodes 3. This additional member 15 may be made from insulating material (such as engineering plastics) or from PCB material. This additional member 15 may extend along part of or the full length of the device, and may extend to cover one or more segments of the device. Due to the likely requirement to electrically insulate adjacent electrode segments from one-another, this part is unlikely to be manufactured from a conducting material such as a metal, but in cases where adjacent electrode segments employ the same voltage, such a material could be used. This additional member 15 may serve several purposes. The member 15 may be used for mounting or locating the device into a larger ion processing apparatus. Alternatively, in cases where an elevated gas pressure is employed within the device, this member 15 may serve to fill the gaps between bridging electrodes 3 of adjacent electrode segments, thus forming at least a partial seal. As noted above, electrodes 3, 5a, 5b may optionally include orifices to allow gas to be fed into the device, and this additional member 15 could be employed to accommodate a gas inlet.

A further feature of the invention as shown in FIG. 7 is the extension of the PCBs 1a, 1b to extend the PCBs 1a, 1b beyond the electrode envelope. These extended cantilever portions of the PCBs 1a, 1b may allow for mounting or location of the device in an ion processing apparatus, may be used for mounting additional electronics components, or for making electrical connections, or allowing further space for electrical tracks to pass through the PCBs 1a, 1b. In short, these cantilever portion(s) may be used to make more space for any of the functions for which the PCBs 1a, 1b are already used. It should be noted that the PCB shape can be any arbitrary shape within the realms of current PCB manufacturing capability.

A further possible feature (not shown) would be to use an insulating packing material similar to 15 on the end faces of the device to restrict gas flow through the gaps between electrodes, leaving only the main aperture through which gas may pass.

The example devices described herein could be used in the field of charged particle optics, more specifically within electrodynamic ion optics, more specifically still in the field of mass spectrometry. For simplicity, the charged particles are referred to here as ions, but in fact the charged particles could include electrons. The device could reasonably be employed as: an ion guide, an ion trap or series of ion traps, an ion storage region or a collision cell. The device could be employed as an ion manipulation device such as that described in WO2012/150351A1. The invention is best suited to these described applications due to the relatively lower tolerance requirements of these devices compared to applications where, for example, mass analysis is performed. In principle, however, the invention could be employed as a low tolerance manufacturing/assembly method for a mass filter or an analytical ion trap.

Figure 8:
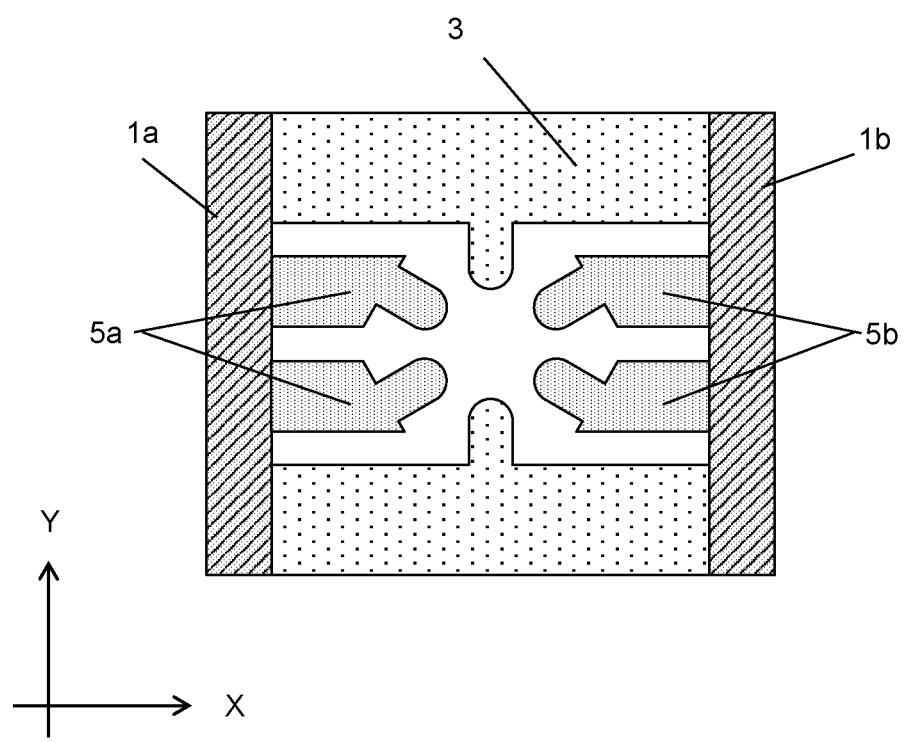
FIG. 8 shows an end view in the XY plane of a sixth multipole device whose electrodes have a hexapole structure.

In the above examples, the device is configured as a quadrupole device, in which four multipole electrodes are employed. Higher order multipoles such as hexapoles or octapoles might be manufactured using a similar method, as shown in FIG. 8. In this embodiment, the manufacturing method has been extended to produce a hexapole structure. This uses the same approach and benefits from the same advantages as the quadrupole structure described above, including ease of assembly, simple alignment of adjacent segments, flexible electrical connections and the option to form a closed- or open-structure device to manipulate gas properties. In principle the techniques and principles described herein could be applied to a multipole device having any number of poles, though due to practical limitations of the number and size of fasteners, the method is unlikely to be desirable for multipole assembles having more than 12 poles.

In standard operation as a multipole device (quadrupole, hexapole, octapole etc), whether operated as an ion guide, collision cell or ion trap, radiofrequency voltages would normally be applied to the poles or rods. The radiofrequency may be applied in any method as is known in the art for application to multipoles: typically such that antiphase RF is applied to adjacent electrodes. In the example of the quadrupole described in most detail above, this means that opposite phases of RF would be applied to the 'bridging' electrodes 3 compared with the side electrodes 5a, 5b supported from a single PCB 1a, 1b. The RF voltage, frequency and waveform shape may be chosen as appropriate for the application, but would normally be in the range of several kHz to several MHz, from a few tens of volts to several kilovolts, and be sinusoidal, square, rectangular, triangular or saw-tooth in nature. Frequently, similar RF will be applied to adjacent structures of the device, but in some applications different waveforms may be applied to adjacent electrode segments of the device. The important point here is that any waveform or set of waveforms with any conditions as normally employed in the art may be used in the current invention.

The device may also be used with static or DC voltages and/or ground applied to the electrodes, such as in use as an electrostatic lens.

Optimum conditions for the above described device include:
Length of electrode segment l: 1 mm<L<1000 mm, more preferably 7 mm<L<500 mm, more preferably 10 mm<L<300 mm and more preferably 10 mm<L<50 mm. Preferences due to restrictions in conventional manufacturing methods at the short end and practical size of the device at the long end.
Inscribed radius of the device r: 0.5 mm<r<100 mm, more preferably 1 mm<r<50 mm, and more preferably 2.5 mm<r<10 mm. Preferences due to manufacturing abilities, applied waveform voltage achievable.

Possible modifications to the above-described device include:
Use of a material other than standard PCB material for the PCBs (e.g. ceramic-based PCB).
Design the bridging electrodes 3 to be made of two components that fit together to form a single bridging electrode 3.
Alternative mounting methods for the electrodes to the support PCBs (e.g. alignment features built in to the electrodes to fit in to alignment holes in the PCBs).
Alternative assembly methods such as using a jig to align the electrodes, thus removing the requirement for the alignment features in the electrodes and PCBs.
"Post machining" of the critical electrode features after assembly of a 'rough-cut' set of electrodes to low tolerances.

It is envisaged that the above-described device would be applicable possibly in the field of electron optics (surface science) and high energy physics, but mainly in mass spectrometry.

When used in this specification and claims, the terms "comprises" and "comprising", "including" and variations thereof mean that the specified features, steps or integers are included. The terms are not to be interpreted to exclude the possibility of other features, steps or integers being present.

The features disclosed in the foregoing description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

For example, although the example devices described above are multipole devices, the same principles may be used to produce ion manipulation devices that are not multipole devices.

For the avoidance of any doubt, any theoretical explanations provided herein are provided for the purposes of improving the understanding of a reader. The inventors do not wish to be bound by any of these theoretical explanations.

All references referred to above are hereby incorporated by reference.

The invention claimed is:

1. An ion manipulation device for guiding or confining ions in an ion processing apparatus, the device having:
a first circuit board, wherein at least one first electrode for manipulating the path of ions is mounted on a mounting surface of the first circuit board;
a second circuit board, wherein at least one second electrode for manipulating the path of ions is mounted on a mounting surface of the second circuit board;
at least one bridging electrode for manipulating the path of ions, wherein the at least one bridging electrode is mounted to both the mounting surface of the first circuit board and the mounting surface of the second circuit board, wherein the bridging electrode is configured to hold the first circuit board and the second circuit board apart from each other in a fixed spatial relationship in which the mounting surface of the second circuit board faces towards the mounting surface of the first circuit board.

2. An ion manipulation device according to claim 1, wherein the first and second circuit boards include circuitry for connecting the first, second and bridging electrodes to one or more external voltage sources and/or ground.

3. An ion manipulation device according to claim 1, wherein the first circuit board, second circuit board, the at least one first electrode, the at least one second electrode and the at least one bridging electrode extend along a length axis of the device.

4. An ion manipulation device according to claim 3, wherein the ion manipulation device is a multipole device, with each of the first, second and bridging electrodes being configured to provide a multipole electrode, the multipole electrodes being arranged around a central chamber of the device and extending along the length axis of the device.

5. An ion manipulation device according to claim 4, wherein the device includes four, six or eight multipole electrodes.

6. An ion manipulation device according to claim 3, wherein the first circuit board, second circuit board and at least one bridging electrode are arranged circumferentially around the length axis and are joined together so as to substantially prevent gas from escaping radially out from the ion manipulation device when the ion manipulation device is in use.

7. An ion manipulation device as set out in claim 3, wherein one or more of the first, second and bridging electrodes is a segmented electrode, wherein each segmented electrode includes multiple electrode segments that are separated from each other in the direction of the length axis of the device.

8. An ion manipulation device as set out in claim 3, wherein the ion manipulation device is divided into multiple regions, each region having a length along the length axis of the device, and each region using the same first and second circuit boards.

9. An ion manipulation device as set out in claim 3, wherein the ion manipulation device includes:
a first region having a first length along the length axis of the device, wherein the first region of the device viewed in cross section perpendicular to the length axis encloses a first area unoccupied by electrodes;
a second region having a second length along the length axis of the device, wherein the second region of the device viewed in cross section perpendicular to the length axis encloses a second area unoccupied by electrodes;
wherein the second area is larger than the first area.

10. An ion manipulation device as set out in claim 3, wherein the ion manipulation device includes:
a first region having a first length in the direction of the length axis of the device, wherein the first region of the device viewed in cross section perpendicular to the length axis encloses a first area unoccupied by electrodes;
a second region having a second length in the direction of the length axis of the device, wherein the second region of the device viewed in cross section perpendicular to the length axis encloses a second area unoccupied by electrodes;
a third region having a third length in the direction of the length axis of the device, wherein the third region of the device viewed in cross section perpendicular to the length axis encloses a third area unoccupied by electrodes;
wherein the second region is between the first and third regions;
wherein the second area is larger than the first and third areas.

11. An ion manipulation device as set out in claim 1, wherein the first and second circuit boards each include a ceramic insulating substrate.

12. An ion manipulation device as set out in claim 1, wherein the first and second circuit boards include one or more dedicated alignment features for use in aligning the first and second circuit boards in the fixed spatial relationship.

13. An ion manipulation device as set out in claim 1, wherein the first and/or second circuit boards include a cantilever portion which extends out from the device beyond an envelope that encloses the first, second and bridging electrodes.

14. A mass spectrometer including an ion manipulation device as set out in claim 1.

15. A method of manufacturing an ion manipulation device according to claim 1.

* * * * *